(12) United States Patent
Nakamura et al.

(10) Patent No.: US 7,696,067 B2
(45) Date of Patent: Apr. 13, 2010

(54) METHOD OF MANUFACTURING DEVICE

(75) Inventors: Masaru Nakamura, Ota-Ku (JP);
Hirokazu Matsumoto, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/354,542

(22) Filed: Jan. 15, 2009

(65) Prior Publication Data

US 2009/0197395 A1 Aug. 6, 2009

(30) Foreign Application Priority Data

Jan. 31, 2008 (JP) .............................. 2008-020336

(51) Int. Cl.
*H01L 21/30* (2006.01)
(52) U.S. Cl. ............................... 438/462; 257/E21.599
(58) Field of Classification Search ................. 438/462, 438/463, 460, 464, 465, 113, 114
See application file for complete search history.

(56) References Cited

U.S. PATENT DOCUMENTS

2007/0105345 A1* 5/2007 Kurosawa .................... 438/460

FOREIGN PATENT DOCUMENTS

JP A 2000-182995 6/2000

* cited by examiner

*Primary Examiner*—Walter L Lindsay, Jr.
*Assistant Examiner*—Reema Patel
(74) *Attorney, Agent, or Firm*—Greer, Burns & Crain, Ltd.

(57) ABSTRACT

A method of manufacturing a device includes: a laser beam-machined groove forming step of irradiating a wafer with a laser beam from the back side of the wafer along planned dividing lines so as to form laser beam-machined grooves along the planned dividing lines; an etching step of etching a back-side surface of the wafer having been subjected to the laser beam-machined groove forming step, so as to remove denatured layers formed at processed surfaces of the laser beam-machined grooves; an adhesive film attaching step of attaching an adhesive film to the back-side surface of the wafer having been subjected to the etching step, and adhering the adhesive film side of the wafer to a surface of a dicing tape; and an adhesive film rupturing step of expanding the dicing tape so as to rupture the adhesive film along individual devices.

1 Claim, 10 Drawing Sheets

METHOD OF MANUFACTURING DEVICE

BACKGROUND OF THE INVENTION

1. Field of the Invention

The present invention relates to a method of manufacturing a device by which a wafer having devices formed in a plurality of regions demarcated by planned dividing lines formed in a grid pattern on the face-side surface of the wafer is divided along the planned dividing lines into individual devices and an adhesive film for die bonding is attached to the back-side surface of each of the devices.

2. Description of the Related Art

In a semiconductor device manufacturing process, for example, it is a common practice to form devices such as ICs (integrated circuits) and LSIs (large-scale integrations) in a plurality of regions demarcated by streets (planned dividing lines) formed in a grid pattern on the face-side surface of a substantially circular disk-shaped semiconductor wafer, and to divide the regions with the devices formed therein along the planned dividing lines, thereby manufacturing the individual devices. As a dividing apparatus for dividing the semiconductor wafer, a cutting apparatus generally called dicing apparatus is used. The cutting apparatus has a cutting blade about 40 μm in thickness, by which the semiconductor wafer is cut along the planned dividing lines. The devices divided in this manner are packaged and put to wide use in electric apparatuses such as cellular phones and personal computers.

An adhesive film for die bonding, which is formed from an epoxy resin or the like in a thickness of 70 to 80 μm and is called a die attach film, is attached to each of the individually divided devices, and each device is bonded to a device-supporting die bonding frame through the adhesive film by heating. In an exemplary method for attaching the adhesive film for die bonding to the back-side surface of the device, the adhesive film is adhered to the back-side surface of the semiconductor wafer, and the semiconductor wafer is adhered to a dicing tape through the adhesive film. Thereafter, the adhesive film together with the semiconductor wafer is cut by a cutting blade along the planned dividing lines formed on the face-side surface of the semiconductor wafer, to form the devices each of which has the adhesive film attached to the back-side surface thereof (refer to, for example Japanese Patent Laid-open No. 2000-182995).

However, when the adhesive film is adhered to the back-side surface of the wafer and the resulting assembly is cut by the cutting blade, the devices thus cut apart may show irregular motions on the adhesive film. Particularly, in the case where the thickness of the wafer is as small as 100 μm or below, the devices may be broken by the shock of the cutting blade which is rotating at a high speed.

In order to solve such a problem, the present applicant has proposed, in Japanese Patent Application No. 2007-70000, a method of manufacturing a device wherein after an adhesive film is adhered to the back-side surface of a wafer and the adhesive film side is adhered to the surface of a dicing tape, the wafer is irradiated with a pulsed laser beam, which has such a wavelength as to be absorbed in the wafer, from the face side of the wafer along planned dividing lines, so as to divide the wafer into individual devices and to cut the adhesive film.

This approach, however, has the following problems. When the wafer is irradiated with the pulsed laser beam having such a wavelength as to be absorbed in the wafer from the face side of the wafer along the planned dividing lines, thermal energy would be concentrated on the irradiated region with the result of generation of debris, and the debris would adhere to device surfaces, thereby lowering the device quality. In addition, when the wafer is divided by irradiation with a laser beam, the divided surfaces would be denatured, resulting in that the individually divided devices show a lowered transverse rupture strength.

SUMMARY OF THE INVENTION

Accordingly, it is an object of the present invention to provide a method of manufacturing a device by which devices each having an adhesive film attached to the back-side surface thereof can be manufactured without lowering device quality and without lowering the transverse rupture strength of the devices.

In accordance with an aspect of the present invention, there is provided a method of manufacturing devices by which a wafer having the devices formed in a plurality of regions demarcated by planned dividing lines formed in a grid pattern on a face-side surface of the wafer is divided along the planned dividing lines into the individual devices having an adhesive film for die bonding attached to a back-side surface of each of the devices, the method including: a laser beam-machined groove forming step of irradiating the wafer with a laser beam, which has such a wavelength as to be absorbed in the wafer, from the back side of the wafer along the planned dividing lines, so as to form laser beam-machined grooves along the planned dividing lines; an etching step of etching the back-side surface of the wafer having been subjected to the laser beam-machined groove forming step, so as to remove denatured layers formed at processed surfaces of the laser beam-machined grooves; an adhesive film attaching step of attaching an adhesive film to the back-side surface of the wafer having been subjected to the etching step, and adhering the adhesive film side to a surface of a dicing tape attached to an annular frame; and an adhesive film rupturing step of expanding the dicing tape so as to rupture the adhesive film along the individual devices.

According to the present invention, the laser beam-machined groove forming step of forming the laser beam-machined grooves along the planned dividing lines of the wafer is carried out by irradiating the wafer with the laser beam having such a wavelength as to be absorbed in the wafer from the back side of the wafer along the planned dividing lines. Therefore, adhesion of debris to device surfaces can be avoided, and the device quality can be prevented from being lowered due to adhesion of debris to the device surfaces.

In addition, according to the present invention, the back-side surface of the wafer provided with the laser beam-machined grooves along the planned dividing lines by carrying out the laser beam-machined groove forming step is etched so as to remove the denatured layers formed at the processed surfaces of the laser beam-machined grooves. Therefore, lowering in the transverse rupture strength of the devices can be obviated.

Besides, after the adhesive film is attached to the back-side surface of the wafer, from which the denatured layers formed at the processed surfaces of the laser beam-machined grooves formed along the planned dividing lines have been removed, and the adhesive film side is adhered to the surface of the dicing tape, the dicing tape is expanded so as to rupture the adhesive film along the individual devices. Accordingly, the devices each having the adhesive film attached to the back-side surface thereof can be manufactured efficiently.

The above and other objects, features and advantages of the present invention and the manner of realizing them will become more apparent, and the invention itself will best be understood from a study of the following description and

DETAILED DESCRIPTION OF THE PREFERRED EMBODIMENTS

Figure 1:
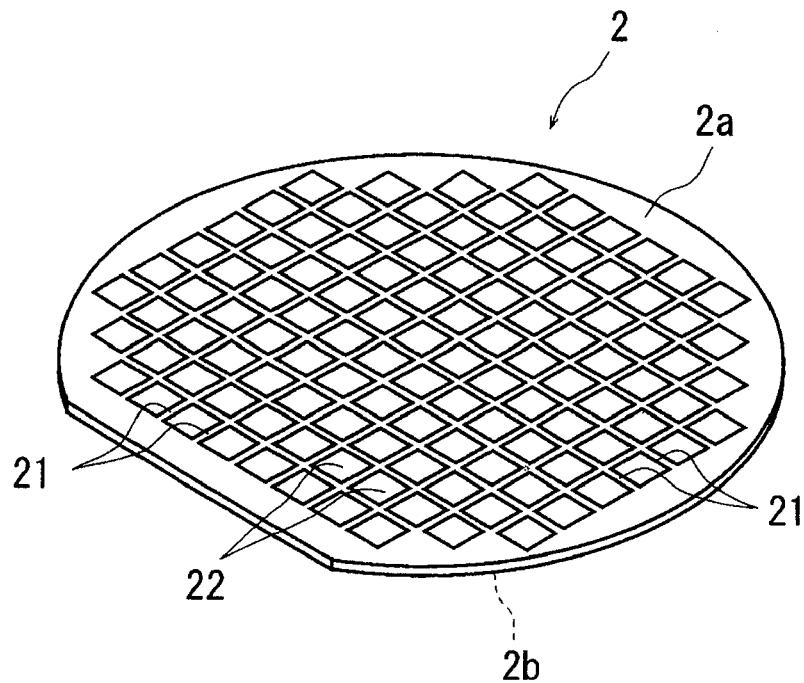
FIG. 1 is a perspective view of a semiconductor wafer as a wafer.
Figure 2:
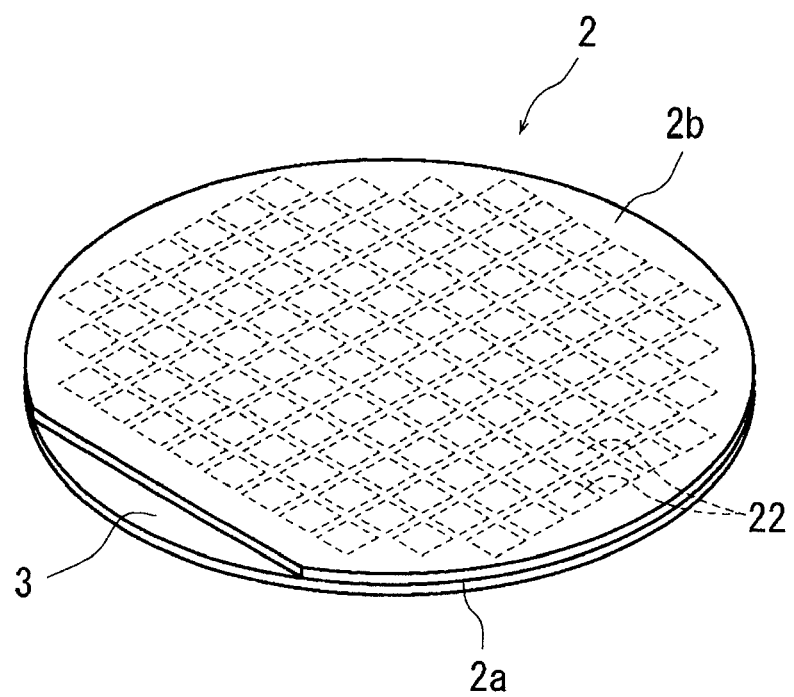
FIG. 2 is a perspective view showing the condition where a protective tape is adhered to the face-side surface of the semiconductor wafer shown in FIG. 1.

Now, preferred embodiments of the method of manufacturing a device according to the present invention will be described in detail below, referring to the attached drawings. FIG. 1 shows a perspective view of a semiconductor wafer as a wafer. The semiconductor wafer 2 shown in FIG. 1 is composed, for example, of a silicon wafer having a thickness of 80 μm, and its face-side surface 2a is provided with a plurality of planned dividing lines 21 in a grid pattern. At the face-side surface 2a of the semiconductor wafer 2, devices 22 such as ICs and LSIs are formed in the plurality of regions demarcated by the plurality of planned dividing lines 21 formed in the grid pattern. To the surface 2a of the semiconductor wafer 2 as above, a protective tape 3 is adhered as shown in FIG. 2 for the purpose of protecting the devices 22 (protective tape adhering step).

After the protective tape 3 is adhered to the face-side surface 2a of the semiconductor wafer 2 by conducting the protective tape adhering step, a laser beam-machined groove forming step is carried out in which the semiconductor wafer 2 is irradiated with a laser beam having such a wavelength as to be absorbed in the semiconductor wafer 2 from the back side of the semiconductor wafer 2 along the planned dividing lines 21, whereby laser beam-machined grooves are formed along the planned dividing lines 21. In the embodiment shown in the figures, the laser beam-machined groove forming step is carried out by use of a laser beam machining apparatus shown in FIG. 3. The laser beam machining apparatus 4 shown in FIG. 3 includes a chuck table 41 for holding a work, laser beam irradiation means 42 for irradiating the work held on the chuck table 41 with a laser beam, and image pickup means 45 for picking up an image of the work held on the chuck table 41. The chuck table 41 is so configured as to hold the work by suction, and to be moved in a machining feed direction of arrow X in FIG. 3 and an indexing feed direction of arrow Y in the figure by a moving mechanism (not shown).

The laser beam irradiation means 42 includes a hollow cylindrical casing 43 disposed substantially horizontally. Pulsed laser beam oscillation means having a pulsed laser beam oscillator, such as a YAG laser oscillator and a YVO4 (Yttrium Vanadate) laser oscillator (not shown), and repetition frequency setting means is disposed in the casing 43. To a tip part of the casing 43 is mounted a condenser 44 for condensing a pulsed laser beam oscillated from the pulsed laser beam oscillation means.

The image pickup means 45 mounted to a tip part of the casing 43 constituting the laser beam irradiation means 42, in the embodiment shown in the figure, includes not only an ordinary image pickup element (CCD (charge-coupled device)) for image pickup by use of a visible beam but also infrared illumination means for irradiating the work with infrared rays, an optical system for catching the infrared rays radiated from the infrared illumination means, an image pickup element (infrared CCD) for outputting an electrical signal corresponding to the infrared rays caught by the optical system, etc., and a signal of the picked-up image is sent from the image pickup means 45 to control means (not shown).

Figure 3:
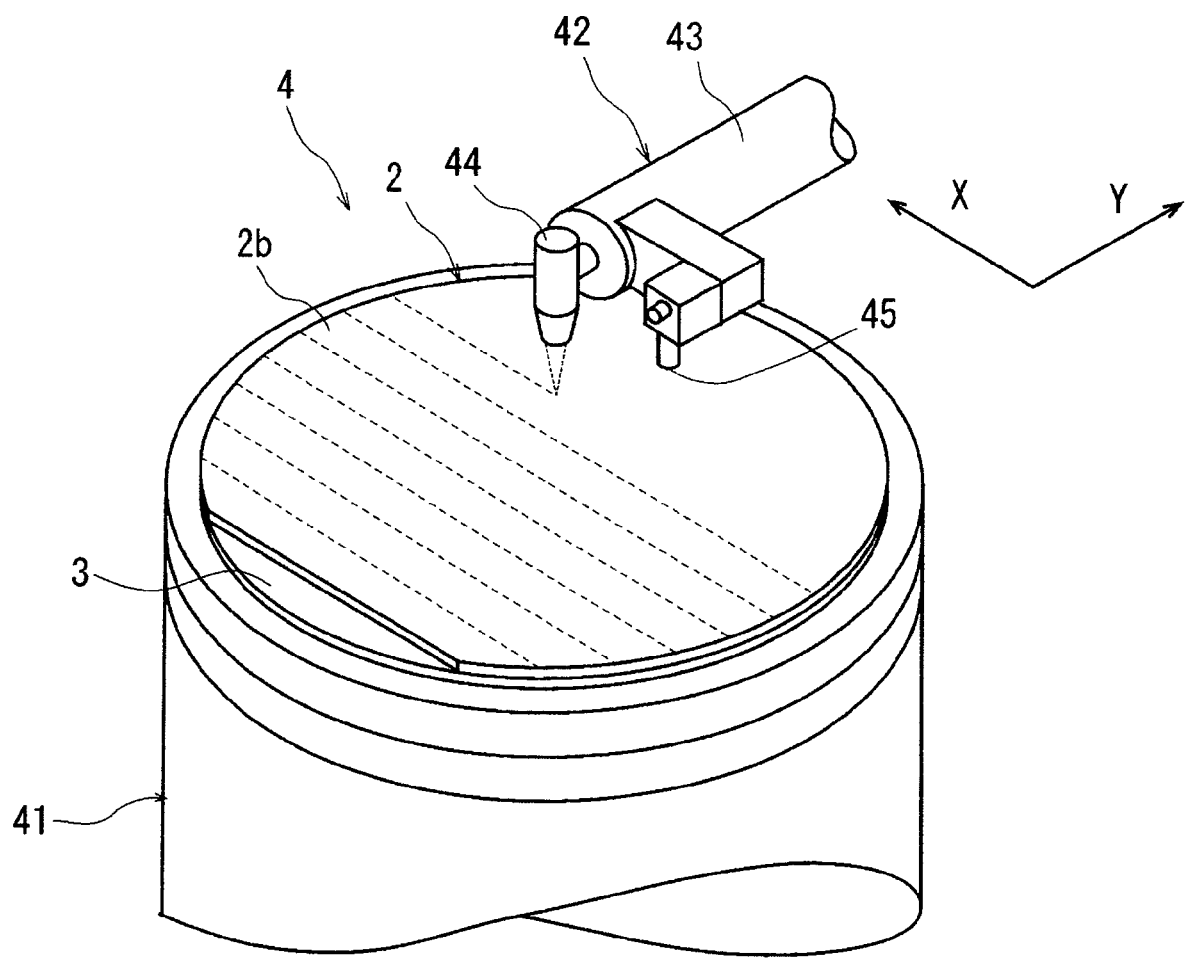
FIG. 3 is a perspective view of an essential part of a laser beam machining apparatus for carrying out a laser beam-machined groove forming step in a method of manufacturing a device according to the present invention.

In carrying out the laser beam-machined groove forming step by use of the laser beam machining apparatus 4 as above-described, the semiconductor wafer 2 is mounted on the chuck table 41 of the laser beam machining apparatus 4, with the protective tape 3 side in contact with the chuck table 41, as shown in FIG. 3. Then, the semiconductor wafer 2 is suction held onto the chuck table 41 by suction means (not shown) (wafer holding step). Therefore, the semiconductor wafer 2 suction held on the chuck table 41 has its face-side surface 2b on the upper side.

After the wafer holding step is performed as above, a laser beam-machined groove forming step is carried out in which the semiconductor wafer 2 is irradiated with a laser beam, having such a wavelength as to be absorbed in the silicon wafer constituting the semiconductor wafer 2, from the back-side surface 2b side of the semiconductor wafer 2 along the planned dividing lines 21, so as to form laser beam-machined grooves along the planned dividing lines 21. In conducting the laser beam-machined groove forming step, first, the chuck table 41 with the semiconductor wafer 2 suction held thereon is positioned into a position just under the image pickup means 45 by the moving mechanism (not shown). Then, an alignment work for detecting a work region of the semiconductor wafer 2 which is to be laser beam machined is carried out by the image pickup means 45 and the control means (not shown). Specifically, the image pickup means 45 and the control means (not shown) perform image processing such as pattern matching for matching the position of the planned dividing line 21 formed in a predetermined direction on the semiconductor wafer 2 and the position of the condenser 44 of the laser beam irradiation means 42 for irradiating the semiconductor wafer 2 with the laser beam along the planned dividing line 21, thereby carrying out alignment of the laser beam irradiation position.

In addition, for the planned dividing line 21 formed on the semiconductor wafer 2 so as to extend orthogonally to the above-mentioned predetermined direction, also, alignment of the laser beam irradiation position is carried out similarly to the above (alignment step). In this case, the face-side surface 2a provided with the planned dividing lines 21, of the semiconductor wafer 2, is located on the lower side. However, the image of the planned dividing lines 21 can be picked up through the back-side surface 2b in a see-through manner, since the image pickup means 45 is composed of the infrared illumination means, the optical system for catching the infrared rays and the image pickup element (infrared CCD) for outputting an electrical signal corresponding to the infrared rays caught, as above-mentioned.

Figure 4A:
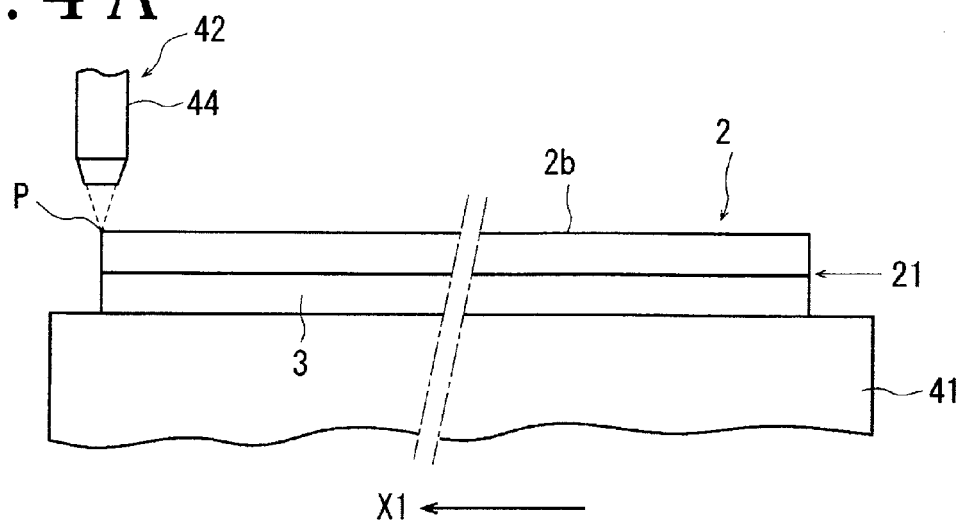
FIGS. 4A to 4C illustrate the laser beam-machined groove forming step in the method of manufacturing a device according to the invention.
Figure 4B:
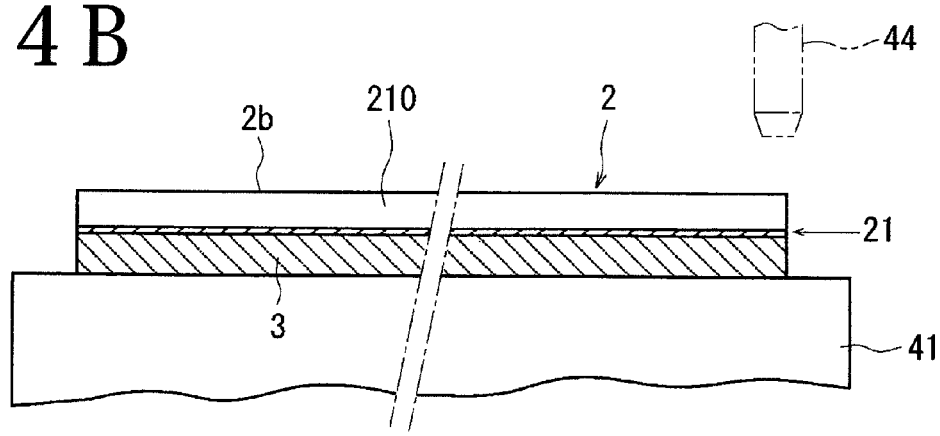
Figure 4C:
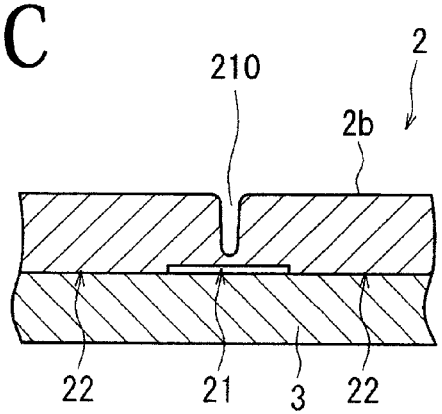

After the alignment step is conducted as above, the chuck table 41 is moved into a laser beam irradiation region where the condenser 44 of the laser beam irradiation means 42 for irradiating the semiconductor wafer 2 with the laser beam is located, as shown in FIG. 4A, and one end (the left end in FIG. 4A) of a predetermined planned dividing line 21 is positioned into a position just under the condenser 44 of the laser beam irradiation means 42. Then, while radiating through the condenser 44 a pulsed laser beam having such a wavelength as to be absorbed in the silicon wafer, the chuck table 41 is moved at a predetermined feed rate in the direction of arrow X1 in FIG. 4A. Thereafter, when the position of irradiation through the condenser 44 has reached the position of the other end of the planned dividing line 21 as shown in FIG. 4B, the radiation of the pulsed laser beam is stopped and the movement of the chuck table 41 is stopped. In this laser beam-machined groove forming step, the converging point P of the pulsed laser beam is adjusted to a position near the back-side surface 2b (upper surface) of the semiconductor wafer 2, whereby the semiconductor wafer 2 is provided in its back-side surface 2b with a laser beam-machined groove 210 along the planned dividing line 21 as shown in FIGS. 4B and 4C.

Thus, in the laser beam-machined groove forming step, the semiconductor wafer 2 is irradiated with the laser beam having such a wavelength as to be absorbed in the wafer from the back-side surface 2b side of the wafer along the planned dividing line 21. Therefore, adhesion of debris to surfaces of devices 22 would not occur, and the quality of the devices 22 can be prevented from being lowered due to adhesion of debris to the surfaces of the devices 22. The processed surfaces of the laser beam-machined groove 210 formed in this manner, in the case where the wafer is a silicon wafer, are denatured layers rendered amorphous, which would cause a lowering in transverse rupture strength. Incidentally, the laser beam-machined groove 210 is so formed that a portion of about 10 μm from the face-side surface 2a (lower surface) of the semiconductor wafer 2 is left intact.

The machining conditions in the laser beam-machined groove forming step are set, for example, as follows.

Light source: LD (laser diode)-excited Q switch Nd: YVO4 pulsed laser

Wavelength: 355 nm (pulsed laser)

Repetition frequency: 20 kHz

Mean output: 10 W

Converged spot diameter: ϕ5 μm

Machining feed rate: 50 mm/sec

After the laser beam-machined groove forming step is performed in this manner along all the planned dividing lines extending in the predetermined direction on the semiconductor wafer 2, the chuck table 41 is turned by 90 degrees, and the laser beam-machined groove forming step is carried out along each of the planned dividing lines 21 extending orthogonally to the predetermined direction.

Figure 5A:
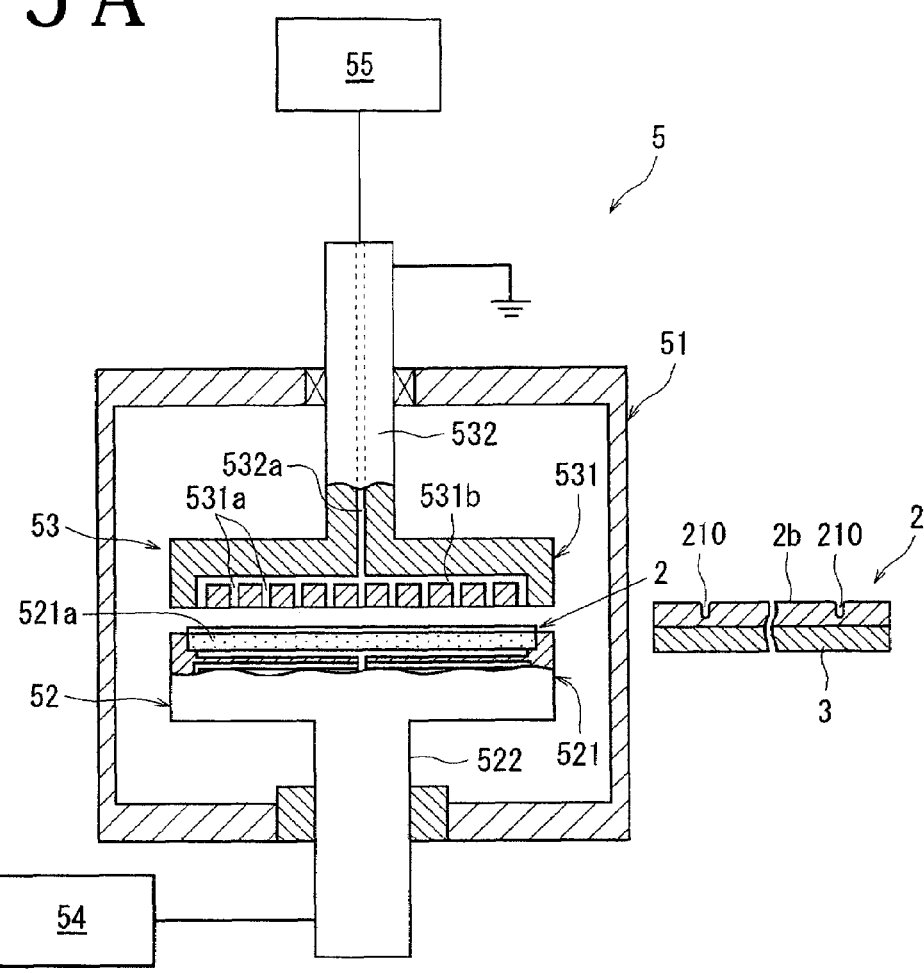
FIGS. 5A and 5B illustrate an etching step in the method of manufacturing a device according to the invention.

After the laser beam-machined groove forming step as above is conducted, an etching step is carried out in which the back-side surface 2b of the semiconductor wafer 2 is etched so as to remove the denatured layers formed at the processed surfaces of the laser beam-machined grooves 210. In the embodiment shown in the figures, the etching step is carried out by use of a plasma etching apparatus 5 shown in FIG. 5A. The plasma etching apparatus 5 shown in FIG. 5A includes a housing 51, and a lower electrode 52 and an upper electrode 53 which are arranged so as to face each other in the housing 51. The lower electrode 52 is composed of a circular disk-shaped work holding part 521, and a cylindrical support part 522 projected from a central portion of the lower surface of the work holding part 521. A suction chuck 521a formed of a porous ceramic material is disposed at the upper surface of the work holding part 521. The semiconductor wafer 2 having been subjected to the laser beam-machined groove forming step is mounted on the suction chuck 521a, and is suction held by operating suction means (not shown). In addition, the support part 522 is connected to high-frequency voltage impressing means 54.

The upper electrode 53 is composed of a circular disk-shaped gas jetting part 531, and a cylindrical support part 532 projected from a central portion of the upper surface of the gas jetting part 531. The upper electrode 53 thus composed of the gas jetting part 531 and the cylindrical support part 532 is so arranged that the gas jetting part 531 faces the work holding part 521 constituting the lower electrode 52. The circular disk-shaped gas jetting part 531 constituting the upper electrode 53 is provided with a plurality of jet holes 531a opened at the lower surface thereof. The plurality of jet holes 531a communicate with gas supply means 55 through communicating passages 531b formed in the gas jetting part 531 and a communicating passage 532a formed in the support part 532. The gas supply means 55 supplies a plasma-generating gas mixture composed mainly of a fluorine-based gas such as sulfur hexafluoride ($SF_6$).

In carrying out the etching step by use of the plasma etching apparatus 5 configured as above, the semiconductor wafer 2 having been subjected to the laser beam-machined groove forming step and accompanied by the protective tape 3 adhered to the face-side surface 2a thereof is mounted on the work holding part 521 constituting the lower electrode 52, with the protective tape 3 in contact with the work holding part 521, and the suction means (not shown) is operated to suction hold the semiconductor wafer 2 on the work holding part 521. Thus, the semiconductor wafer 2 suction held on the work holding part 521 has its back-side surface 2b on the upper side.

Next, the gas supply means 55 is operated to supply the plasma-generating gas to the upper electrode 53. The plasma-generating gas supplied from the gas supply means 55 is passed through the communicating passage 532a formed in the support part 532 and the communicating passage 531b formed in the gas jetting part 531, to be jetted from the plurality of jet holes 531a toward the back-side surface 2b (upper surface) of the semiconductor wafer 2 held on the work holding part 521 of the lower electrode 52. In the condition where the plasma-generating gas is being supplied in this manner, a high-frequency voltage is impressed between the lower electrode 52 and the upper electrode 53 from the high-frequency voltage impressing means 54. This results in that a plasma is generated in the space between the lower electrode 52 and the upper electrode 53, and an active substance generated by the plasma acts on the back-side surface 2b of the semiconductor wafer 2. The plasma-generating gas mixture composed mainly of the fluorine-based gas etches the back-side surface 2b and the processed surfaces of the laser beam-machined grooves 210 of the semiconductor wafer 2 formed of silicon.

Figure 5B:
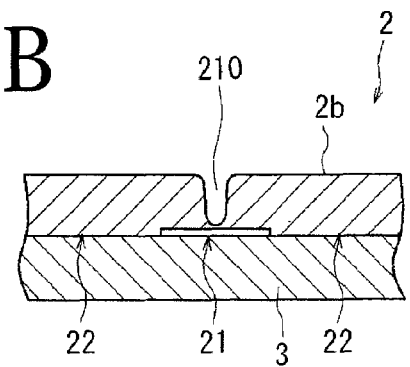

Consequently, as shown in FIG. 5B, the back-side surface 2b of the semiconductor wafer 2 is etched by a predetermined amount, whereby grinding strains remaining at the back-side surface 2b are removed; at the same time, the processed surfaces of the laser beam-machined grooves 210 are also etched by predetermined amounts, whereby the denatured layers formed at the processed surfaces are removed. In the etching step, the laser beam-machined grooves 210 may be etched down to the face-side surface 2a of the semiconductor wafer 2, thereby dividing the semiconductor wafer 2 into the individual devices. Or, alternatively, the etching may be so conducted that semiconductor wafer portions of several micrometers ranging from the bottoms of the laser beam-machined grooves 210 to the face-side surface 2a of the semiconductor wafer 2 are left intact. In this manner, the back-side surface 2b of the semiconductor wafer 2 provided with the laser beam-machined grooves 210 along the planned dividing lines by conducting the laser beam-machined groove forming step is etched, and the denatured layers formed at the processed surfaces of the laser beam-machined grooves 210 are removed. Therefore, lowering in the transverse rupture strength of the devices is obviated.

Incidentally, while an example in which the etching step is carried out by plasma etching using a plasma-generating gas composed mainly of a fluorine-based gas has been described above, the etching step may be carried out by wet etching in which an etching solution composed of a liquid mixture of nitric acid and hydrofluoric acid is used.

After the etching step as above is conducted, an adhesive film attaching step is carried out in which an adhesive film is attached to the back-side surface 2b of the semiconductor wafer 2 and the adhesive film side is adhered to the surface of a dicing tape attached to an annular frame. A first embodiment of the adhesive film attaching step will be described, referring to FIGS. 6A to 7B.

Figure 6A:
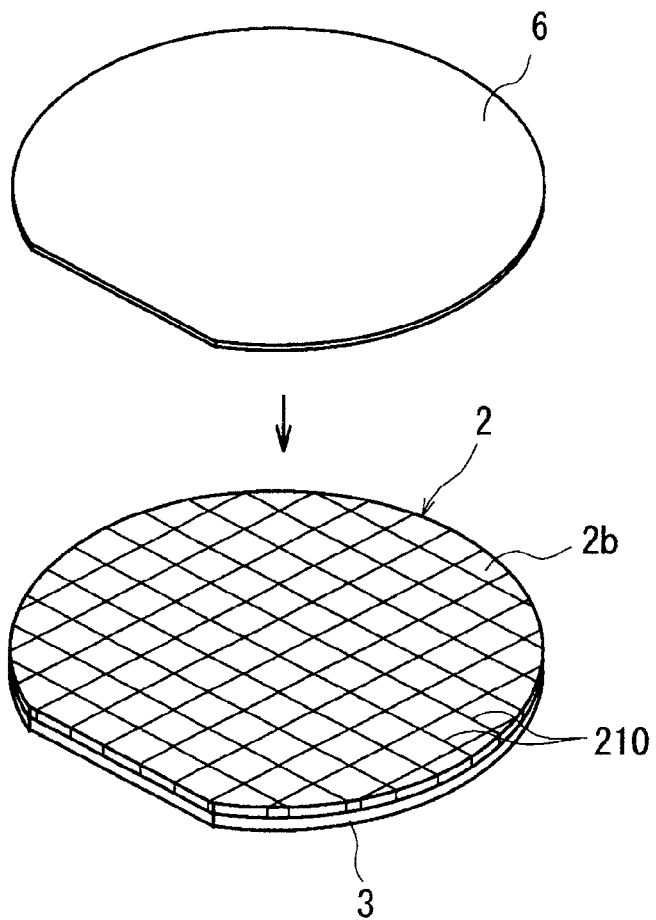
FIGS. 6A and 6B illustrate a first embodiment of an adhesive film attaching step in the method of manufacturing a device according to the invention.
Figure 6B:
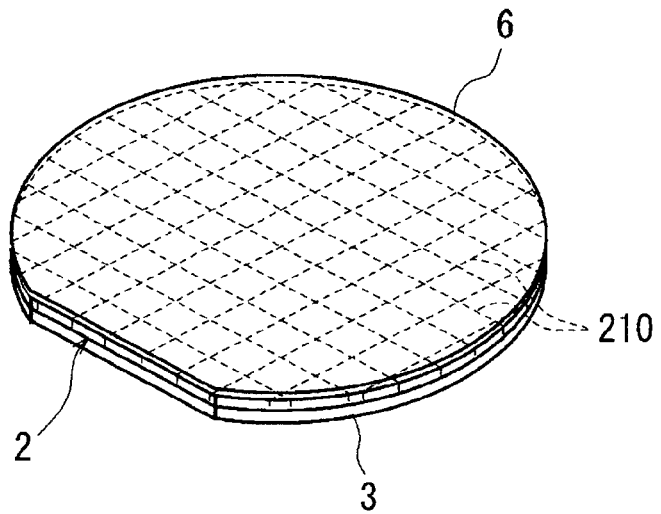
Figure 7A:
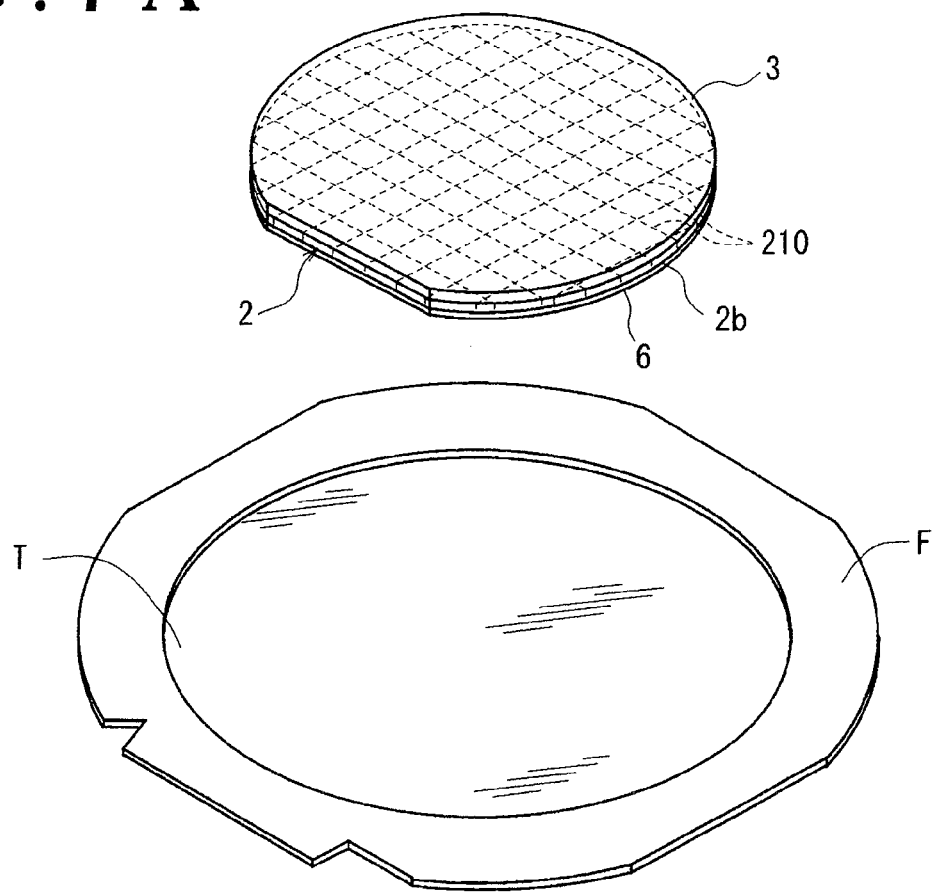
FIGS. 7A and 7B illustrate the first embodiment of the adhesive film attaching step in the method of manufacturing a device according to the invention.
Figure 7B:
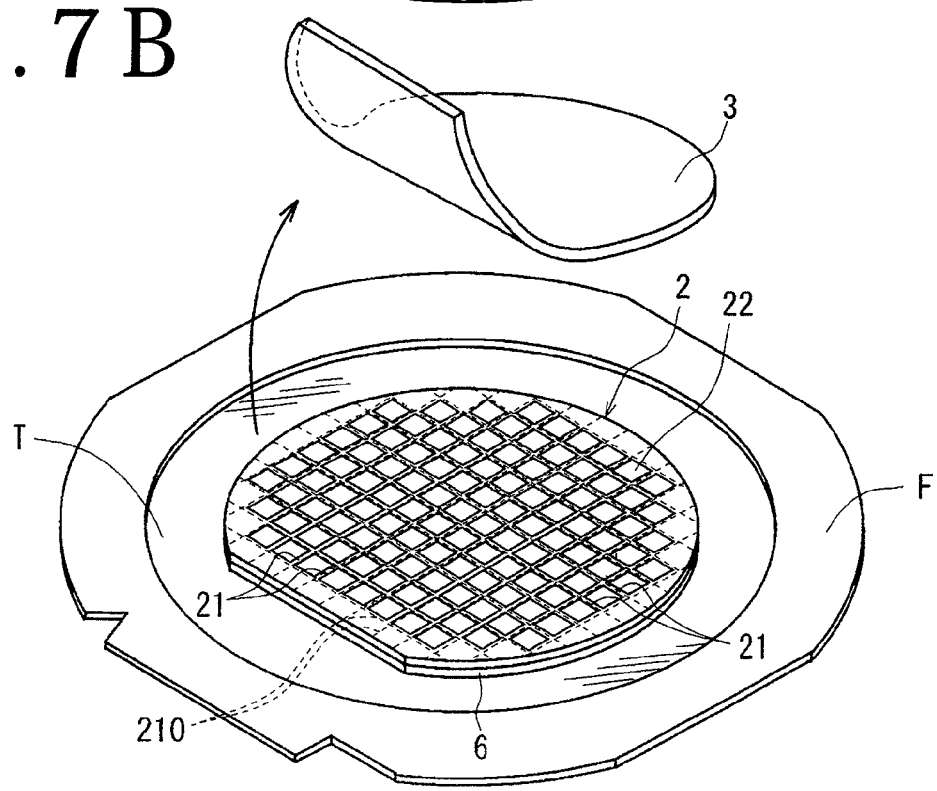

First, as shown in FIGS. 6A and 6B, an adhesive film for die bonding is attached to the back-side surface 2b of the semiconductor wafer 2 having been subjected to the above-mentioned etching step. Specifically, an adhesive film 6 is attached to the back-side surface 2b of the semiconductor wafer 2. In this case, with heating at a temperature of 80 to 200° C., the adhesive film 6 is pressed against the back-side surface 2b of the semiconductor wafer 2, to be thereby adhered to the latter. Incidentally, the adhesive film 6 is composed of a 20 μm-thick film material formed of an epoxy resin or an acrylic resin. Subsequently, as shown in FIGS. 7A and 7B, the adhesive film 6 side of the semiconductor wafer 2 is adhered to the surface of a dicing tape T which is attached, at its peripheral part, to an annular frame F so as to cover an inside aperture portion of the annular frame F. Then, the protective tape 3 adhered to the face-side surface 2a of the semiconductor wafer 2 is peeled off (protective tape peeling step).

Figure 8A:
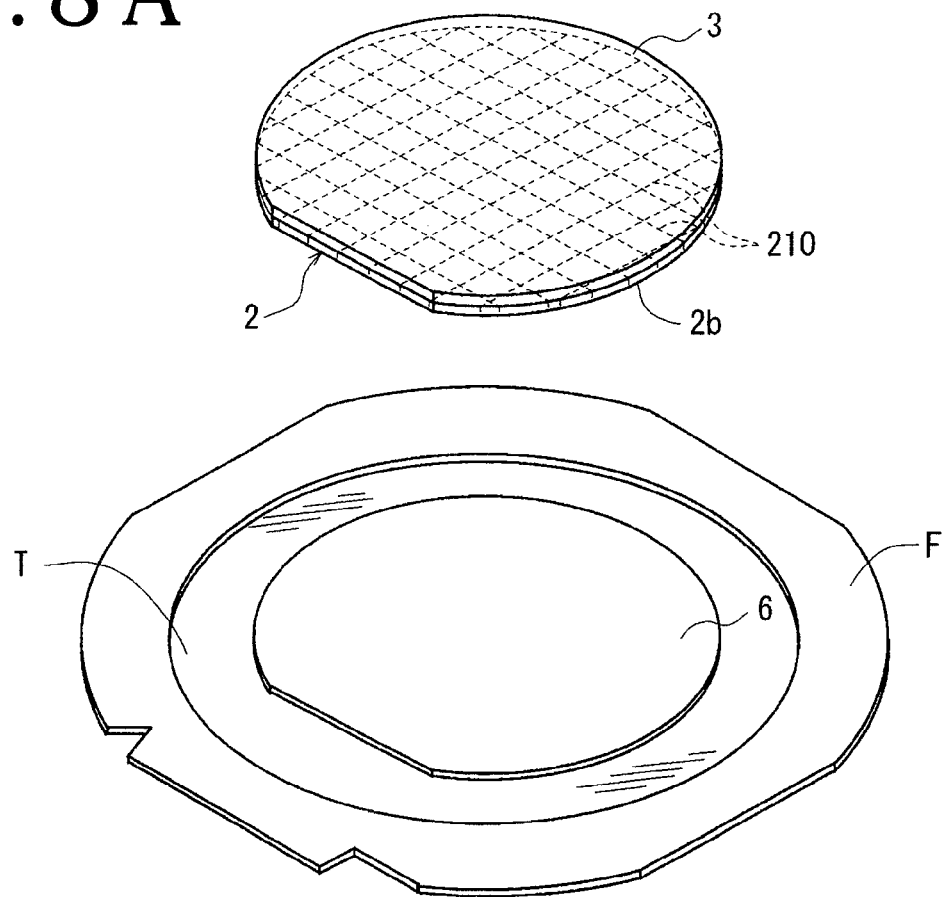
FIGS. 8A and 8B illustrate a second embodiment of the adhesive film attaching step in the method of manufacturing a device according to the invention.
Figure 8B:
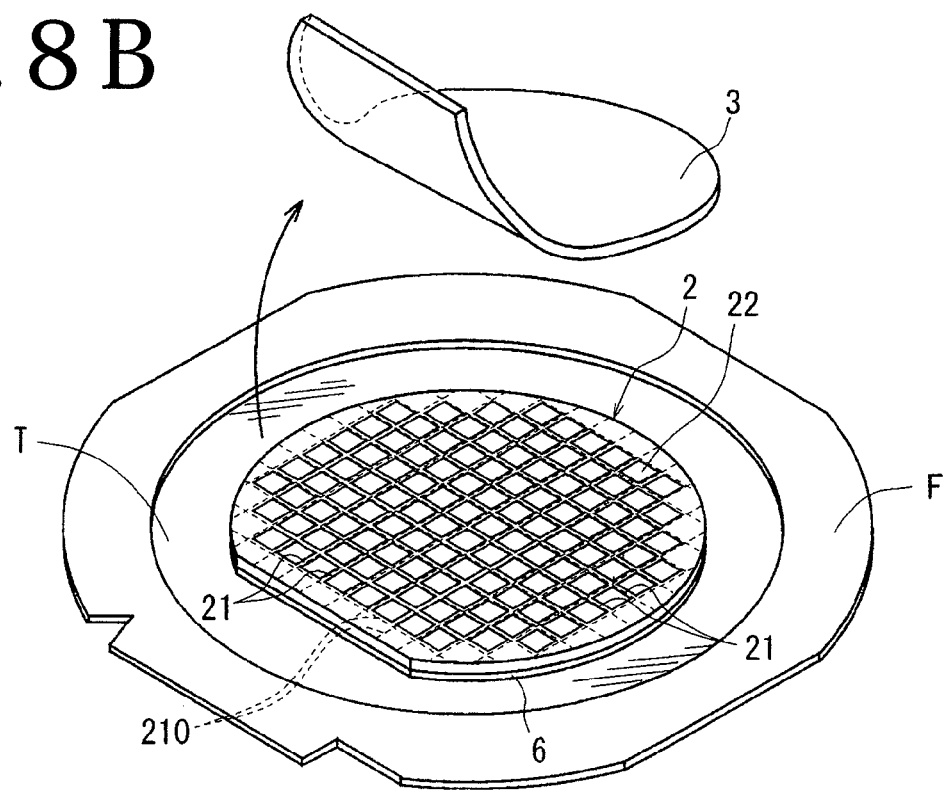

Now, another embodiment of the adhesive film attaching step will be described, referring to FIGS. 8A and 8B. In this embodiment, use is made of a dicing tape with adhesive film, which has an adhesive film 6 preliminarily adhered to the surface of a dicing tape T. Specifically, as shown in FIGS. 8A and 8B, the back-side surface 2b of the semiconductor wafer 2 having been subjected to the above-mentioned etching step is attached to the adhesive tape 6 adhered to the surface of the dicing tape T which is attached, at its peripheral part, to the annular frame F so as to cover the inside aperture portion of the annular frame F. In this case, with heating at a temperature of 80 to 200° C., the adhesive tape 6 is pressed against the back-side surface 2b of the semiconductor wafer 2, to be thereby adhered to the latter. Then, the protective tape 3 adhered to the face-side surface 2a of the semiconductor wafer 2 is peeled off (protective tape peeling step). Where the dicing tape with adhesive film is thus used, attaching the back-side surface 2b of the semiconductor wafer 2 to the adhesive film 6 adhered to the surface of the dicing tape T results in that the semiconductor wafer 2 with the adhesive film 6 attached thereto is supported by the dicing tape T attached to the annular frame F.

After the adhesive film attaching step is conducted as above-mentioned, an adhesive film rupturing step is carried out in which the dicing tape T is expanded so as to rupture the adhesive film 6 along the individual devices. In the embodiment shown in the figures, the adhesive film rupturing step is carried out by use of a picking-up device shown in FIG. 9. The picking-up device 7 shown in FIG. 9 includes a base 71, a first table 72 disposed on the base 71 so as to be movable in the direction of arrow Y, a second table 73 disposed on the first table 72 so as to be movable in the direction of arrow X which is orthogonal to arrow Y. The base 71 is formed in a rectangular shape, and, on the upper surfaces of both side parts of the base 71, two guide rails 711, 712 are respectively disposed along the direction of arrow Y and in parallel to each other. Incidentally, of the two guide rails, the guide rail 711 on one side is provided in its upper surface with a guide groove 711a which is V-shaped in section.

The first table 72 is formed in a window frame-like shape having a rectangular aperture 721 in a central portion thereof. On the lower surface of a side part on one side of the first table 72, a guided rail 722 is provided which is slidably fitted in the guide groove 711a formed in the one-side guide rail 711 of the base 71. In addition, on the upper surfaces of both side parts of the first table 72, two guide rails 723, 724 are respectively disposed in the direction orthogonal to the guided rail 722 and in parallel to each other. Incidentally, of the two guide rails, the guide rail 723 on one side is provided in its upper surface with a guide groove 723a which is V-shaped in section. Of the first table 72 thus configured, the guided rail 722 is fitted in the guide groove 711a formed in the one-side guide rail 711 of the base 71, and the lower surface of a side part on the other side is mounted on the other-side guide rail 712 of the base 71. The picking-up device 7 in the embodiment shown in the figure has first moving means 74 by which the first table 72 is moved in the direction of arrow Y along the guide rails 711, 712.

The second table 73 is formed in a rectangular shape, and, on the lower surface of its side part on one side, a guided rail 732 is provided which is slidably fitted in the guide groove 723a formed in the one-side guide rail 723 of the first table 72. Of the second table 73 thus configured, the guided rail 732 is fitted in the guide groove 723a formed in the one-side guide rail 723 of the first table 72, and the lower surface of its side part on the other side is mounted on the other-side guide rail 724 of the first table 72. The picking-up device 7 in the embodiment shown in the figure has second moving means 75 by which the second table 73 is moved in the direction of arrow X along the guide rails 723, 724 of the first table 72.

The picking-up device 7 in the embodiment shown in the figure includes frame holding means 76 for holding the above-mentioned annular frame F, and tape expanding means 77 for expanding the dicing tape T attached to the annular frame F held by the frame holding means 76. The frame holding means 76 is composed of an annular frame holding member 761, and a plurality of clamps 762 as fixing means which are disposed at the outer periphery of the frame holding member 761. The upper surface of the frame holding member 761 forms a mount surface 761*a* on which to mount the annular frame F, and the annular frame F is mounted on the mount surface 761*a*. The annular frame F thus mounted on the mount surface 761*a* is fixed to the frame holding member 761 by the clamps 762. The frame holding means 76 thus configured is disposed on the upper side of the second table 73, and is so supported that it can be advanced and retracted in the vertical direction by the tape expanding means 77 which will be described later.

Figure 10A:
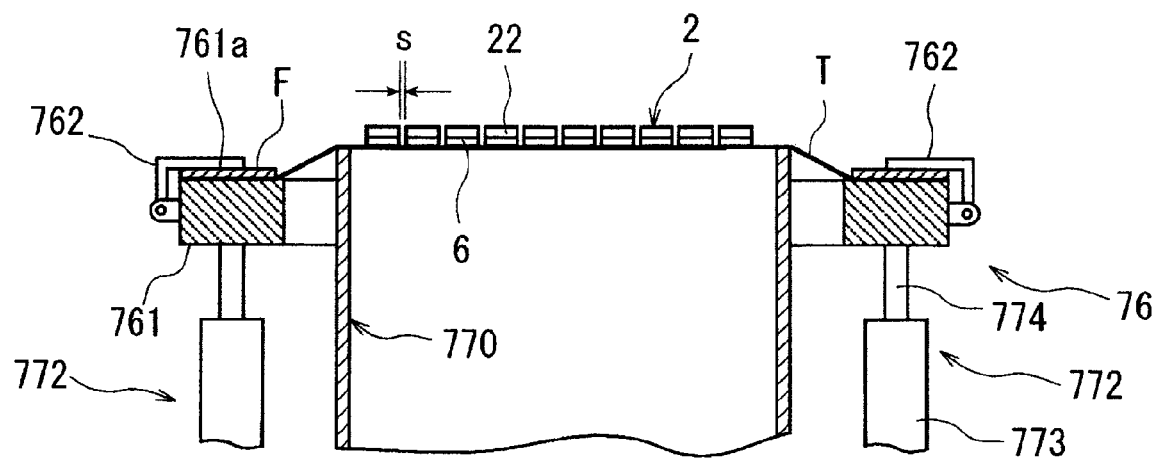
FIGS. 10A and 10B illustrate the adhesive film rupturing step in the method of manufacturing a device according to the invention.
Figure 10B:
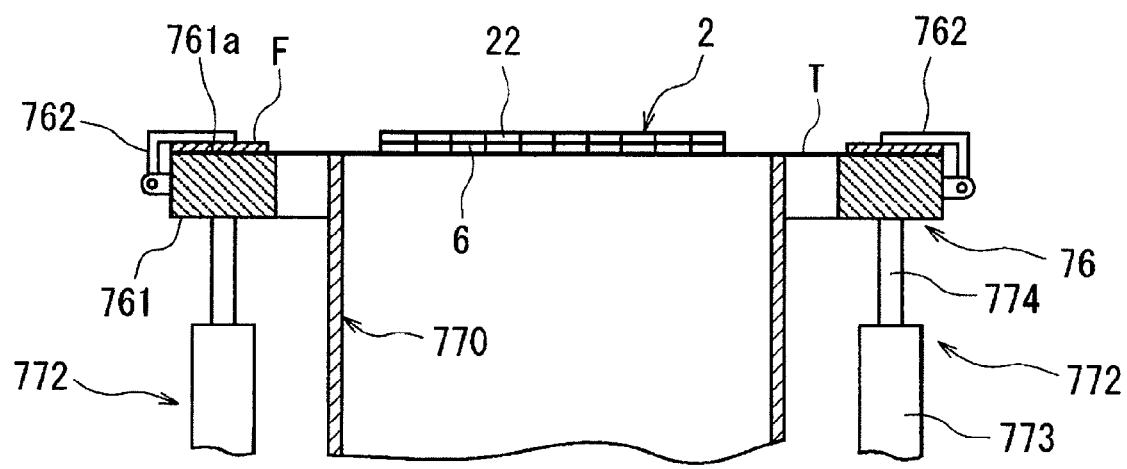

The tape expanding means 77 has an expansion drum 770 disposed on the inside of the annular frame holding member 761. The expansion drum 770 has an inner diameter and an outer diameter which are smaller than the inner diameter of the annular frame F and greater than the outer diameter of the semiconductor wafer 2 adhered to the dicing tape T attached to the annular frame F. Besides, the expansion drum 770 is provided at its lower end part with an attaching part to be turnably fitted in the inner peripheral surface of a hole (not shown) provided in the second table 73, and is provided at the upper outer peripheral surface of the attaching part with a support flange 771 which is projected in the radial direction. The tape expanding means 77 in the embodiment shown in the figure has support means 772 by which the annular frame holding member 761 can be advanced and retracted in the vertical direction. The support means 772 is composed of a plurality of air cylinders 773 disposed on the support flange 771, and piston rods 774 thereof are connected to the lower surface of the annular frame holding member 761. The support means 772 thus composed of the plurality of air cylinders 773 selectively moves the annular frame holding member 761 into a reference position in which the mount surface 761*a* of the annular frame holding member 761 is at substantially the same height as the upper end of the expansion drum 770 as shown in FIG. 10A and an expansion position in which the mount surface 761*a* of the annular frame holding member 761 is deviated by a predetermined amount downwards (in the figure) from the upper end of the expansion drum 770 as shown in FIG. 10B.

Figure 9:
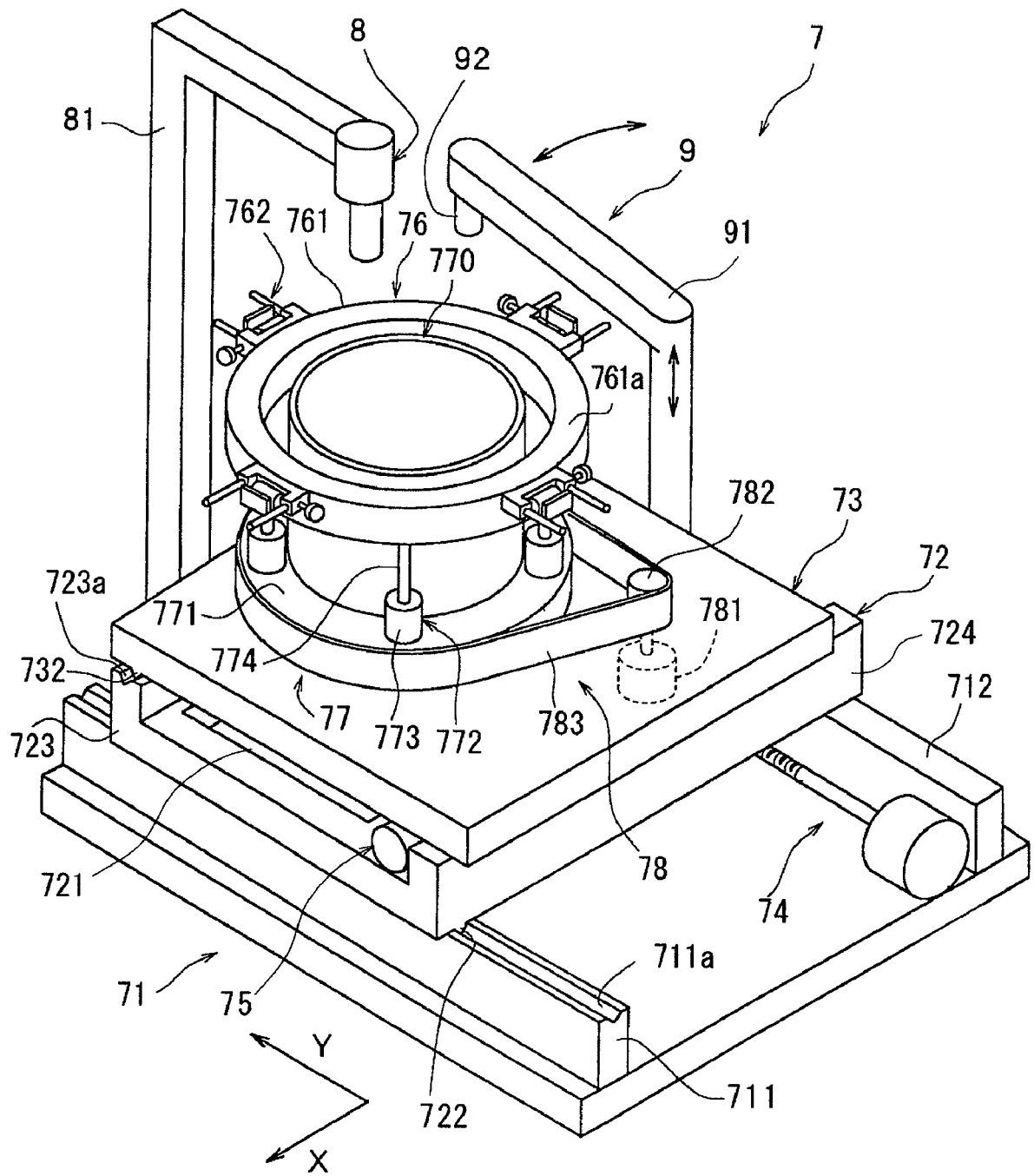
FIG. 9 is a perspective view of a picking-up device for carrying out an adhesive film rupturing step in the method of manufacturing a device according to the invention.

As shown in FIG. 9, the picking-up device 7 has turning means 78 for turning the expansion drum 770 and the frame holding member 761. The turning means 78 is composed of a pulse motor 781 disposed at the second table 73, a pulley 782 attached to a rotary shaft of the pulse motor 781, and an endless belt 783 wrapped around the pulley 782 and the support flange 771 of the expansion drum 770. The turning means 78 thus configured, by driving the pulse motor 781, turns the expansion drum 770 through the functions of the pulley 782 and the endless belt 783.

The picking-up device 7 has detection means 8 for detecting the device 22 of the semiconductor wafer 2 supported, through the dicing tape T, on the annular frame F held by the annular frame holding member 761. The detection means 8 is attached to an L-shaped support column 81 disposed on the base 71. The detection means 8 is composed of an optical system and an image pickup element (CCD) or the like, picks up an image of the device 22 of the semiconductor wafer 2 supported, through the dicing tape T, on the annular frame F held by the annular frame holding member 761, converts the picked-up image into an electrical signal, and sends the signal to the control means (not shown).

In addition, the picking-up device 7 has picking-up means 9 for picking up the individually divided devices 22 from the dicing tape T. The picking-up means 9 is composed of a slewing arm 91 disposed on the base 71, and a pick-up collet 92 attached to the tip of the slewing arm 91. The slewing arm 91 is slewed by driving means (not shown). Incidentally, the slewing arm 91 is configured to be movable in the vertical direction, and the pick-up collet 92 attached to the tip thereof can pick up the individually divided devices 22 adhered to the dicing tape T.

The picking-up device 7 in the embodiment shown in the figure is configured as above-mentioned, and the adhesive film rupturing step and a picking-up step carried out by use of the picking-up device 7 will be described referring mainly to FIGS. 10A to 11. The annular frame F supporting, through the dicing tape T, the semiconductor wafer 2 having been subjected to the above-mentioned wafer supporting step and accompanied by the adhesive film 6 attached to the back-side surface thereof is mounted on the mount surface 761*a* of the frame holding member 761 constituting the frame holding means 76, as shown in FIG. 10B, and is fixed to the frame holding member 761 by the clamps 762 (frame holding step). In this instance, the frame holding member 761 is located in the reference position shown in FIG. 10B.

After the annular frame F supporting, through the dicing tape T, the semiconductor wafer 2 accompanied by the adhesive film 6 attached to its back-side surface is fixed to the frame holding member 761 located in the reference position as shown in FIG. 10B, the plurality of air cylinders 773 as the support means 772 constituting the tape expanding means 77 are operated to lower the annular frame holding member 761 to the expansion position shown in FIG. 10A. Therefore, the annular frame F fixed on the mount surface mount surface 761*a* of the frame holding member 761 is also lowered, so that the dicing tape T attached to the annular frame F is brought into contact with the upper end edge of the expansion drum 770 and is expanded, as shown in FIG. 10A. As a result, tensile forces in radial directions are exerted on the adhesive film 6 attached to the dicing tape T, so that the adhesive film 6 is ruptured along the individual devices 22 (adhesive film rupturing step). Incidentally, in the case where the semiconductor wafer 2 is not divided into the individual devices in the above-mentioned etching step, the semiconductor wafer 2 has semiconductor wafer portions of several micrometers left intact in the range from the bottoms of the laser beam-machined grooves 210 to the face-side surface 2*a*. However, since the tensile forces in the radial directions are exerted on the adhesive film 6 when the dicing tape T is expanded as above-mentioned, the semiconductor wafer 2 is divided along the laser beam-machined grooves 210 into the individual devices 22.

After the adhesive film rupturing step is carried out as above-described, the first moving means 74 and the second moving means 75 are operated to move the first table 72 in the direction of arrow Y (see FIG. 9) and to move the second table 73 in the direction of arrow X (see FIG. 9), and the individual devices 22 adhered through the adhesive film 6 to the dicing tape T attached to the annular frame F held by the frame holding member 761 are positioned into a position just under the detection means 8. Then, by operating the detection means 8, it is checked if the gaps between the individual devices 22 coincide with the direction of arrow Y or the direction of arrow X. If the gaps between the individual devices 22 are deviated from the direction of arrow Y or the direction of arrow X, the turning means 78 is operated to turn the frame holding means 76 so that the gaps will coincide with the direction of arrow Y or the direction of arrow X.

Figure 11:
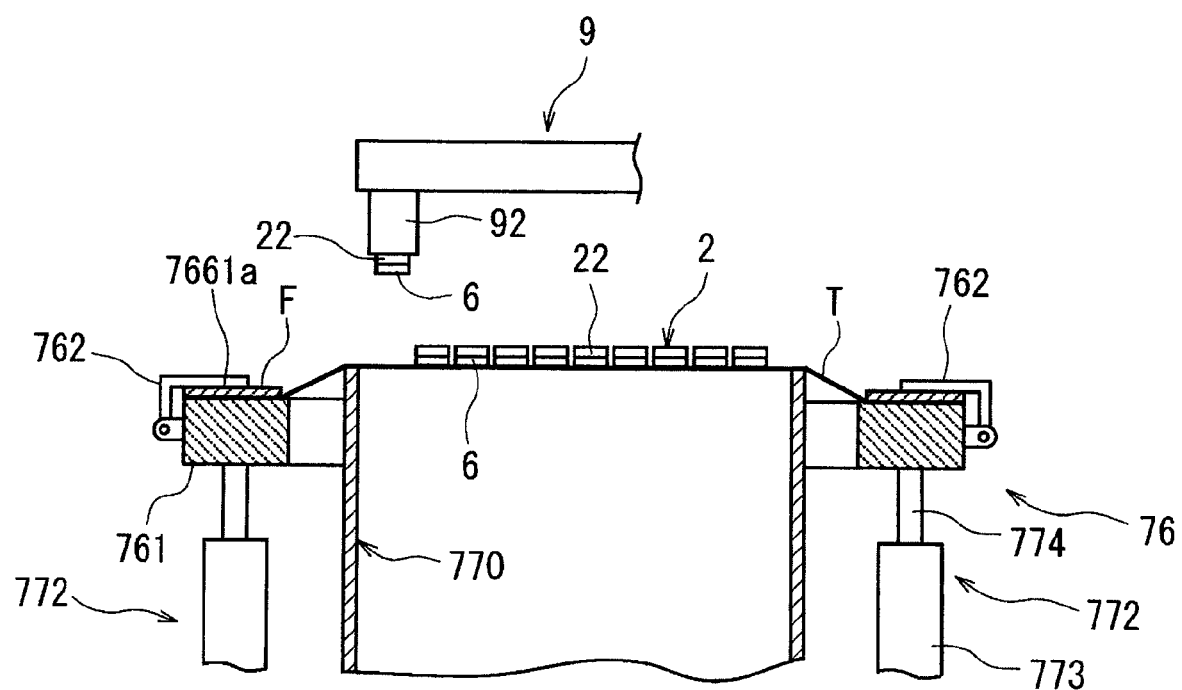
FIG. 11 illustrates a picking-up step in the method of manufacturing a device according to the invention.

Next, while moving the first table 72 in the direction of arrow Y (see FIG. 9) and moving the second table 73 in the direction of arrow X (see FIG. 9), the picking-up means 9 is operated to suck the device 22 (with the adhesive film 6 attached to its back-side surface) positioned in a predetermined position by the pick-up collet 92 and to release the device 22 from the dicing tape T, thereby picking up the device 22 (picking-up step) as shown in FIG. 11, and feeds the device 22 to a tray (not shown) or to a die bonding step. In this picking-up step, the device 22 can be easily picked up without making contact with the adjacent devices 22, since the gaps between the individual devices 22 attached to the adhesive film 6 have been widened as above-mentioned. Accordingly, the devices 22 can be picked up assuredly, without being damaged due to contact with one another.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing devices by which a wafer having the devices formed in a plurality of regions demarcated by planned dividing lines formed in a grid pattern on a face-side surface of said wafer is divided along said planned dividing lines into the individual devices having an adhesive film for die bonding attached to a back-side surface of each said device, said method comprising:

a laser beam-machined groove forming step of irradiating said wafer with a laser beam, which has such a wavelength as to be absorbed in said wafer, from the back side of said wafer on said back-side surface along said planned dividing lines, so as to form laser beam-machined grooves along said planned dividing lines extending from said back-side surface to a predetermined depth of said wafer;

an etching step of etching said back-side surface of said wafer having been subjected to said laser beam-machined groove forming step, so as to remove denatured layers formed at processed surfaces of said laser beam-machined grooves;

an adhesive film attaching step of attaching an adhesive film to said back-side surface of said wafer having been subjected to said etching step, and adhering the adhesive film side to a surface of a dicing tape attached to an annular frame; and an adhesive film rupturing step of expanding said dicing tape so as to rupture said adhesive film along the individual devices.

* * * * *